United States Patent
Baiocco et al.

(10) Patent No.: US 7,471,548 B2
(45) Date of Patent: Dec. 30, 2008

(54) STRUCTURE OF STATIC RANDOM ACCESS MEMORY WITH STRESS ENGINEERING FOR STABILITY

(75) Inventors: Christopher V. Baiocco, Newburgh, NY (US); Xiangdong Chen, Poughquag, NY (US); Young G. Ko, Fishkill, NY (US); Melanie J. Sherony, Fishkill, NY (US)

(73) Assignees: International Business Machines Corporation, Armonk, NY (US); Samsung Electronics Co., Ltd., Gyeonggi-Do (KR)

( * ) Notice: Subject to any disclaimer, the term of this patent is extended or adjusted under 35 U.S.C. 154(b) by 163 days.

(21) Appl. No.: 11/611,569

(22) Filed: Dec. 15, 2006

(65) Prior Publication Data
US 2008/0142895 A1 Jun. 19, 2008

(51) Int. Cl.
*G11C 11/412* (2006.01)
*H01L 29/78* (2006.01)
(52) U.S. Cl. .................. 365/156; 365/154; 365/51; 365/72; 257/418; 257/903
(58) Field of Classification Search .................. 365/51, 365/63, 72, 156, 154; 257/190, 418, 903
See application file for complete search history.

(56) References Cited

U.S. PATENT DOCUMENTS

| | | | |
|---|---|---|---|
| 6,573,172 B1 * | 6/2003 | En et al. ................... 438/626 |
| 6,984,564 B1 | 1/2006 | Huang et al. |
| 7,232,730 B2 * | 6/2007 | Chen et al. ................ 438/301 |
| 7,388,267 B1 * | 6/2008 | Chen et al. ................ 257/418 |
| 2003/0040158 A1 | 2/2003 | Saitoh |
| 2006/0099765 A1 * | 5/2006 | Yang ........................ 438/301 |
| 2008/0142895 A1 * | 6/2008 | Baiocco et al. ............ 257/369 |

* cited by examiner

*Primary Examiner*—Andrew Q Tran
(74) *Attorney, Agent, or Firm*—Scully, Scott, Murphy & Presser, P.C.; Yuanmin Cai

(57) ABSTRACT

An integrated circuit (IC) is provided that includes at least one static random access memory (SRAM) cell wherein performance of the SRAM cell is enhanced, yet with good stability and writability. In particular, the present invention provides an IC including at least one SRAM cell wherein the gamma ratio is about 1 or greater. The gamma ratio is increased with degraded pFET device performance. Morever, in the inventive IC there is no stress liner boundary present in the SRAM region and ion variation for all devices is reduced as compared to that of a conventional SRAM structure. The present invention provides an integrated circuit (IC) that comprises at least one SRAM cell including at least one nFET and at least one pFET; and a continuous relaxed stressed liner located above and adjoining the nFET and the pFET.

1 Claim, 1 Drawing Sheet

STRUCTURE OF STATIC RANDOM ACCESS MEMORY WITH STRESS ENGINEERING FOR STABILITY

FIELD OF THE INVENTION

The present invention relates to an integrated circuit (IC) and more particularly, to an IC including a static random access memory (SRAM) having improved device performance which results in good stability and writability.

BACKGROUND OF THE INVENTION

The shrinking of metal oxide semiconductor field effect transistor (MOSFET) dimensions for high density, low power and enhanced performance requires reduced power supply voltages. As a result, dielectric thickness and channel length of the transistors are scaled with power supply voltage.

A static random access memory (SRAM) is a significant memory device due to its high speed, low power consumption, and simple operation. Unlike a dynamic random access memory (DRAM) cell, the SRAM does not need to regularly refresh the stored data and it has a straightforward design. However, SRAM stability is severely impacted by scaling. Small mismatches in the devices during processing can cause the cell to favor one of the states, either a '1' or a '0'. Mismatches can result from dislocations between the drain and the source or from dopant implantation or thermal anneal temperature fluctuation.

The SRAM cell stability determines the soft-error and the sensitivity of the memory cell to variations in process and operating conditions. One important parameter for the stability is called "gamma ratio", which is the ratio between the pass-gate nFET ion current and the pull-up pFET ion current.

Stress engineering has been used to improve device performance of FET devices. In particular, stressed liners have been used in recent technologies to improve the device performance. A stressed liner can improve only one type (n-type or p-type) of device, while degrading performance of the other type of device. For example, tensile stress liners are employed for n-type FET device performance improvement, yet the same degrades the device performance of p-type FETs. Similarly, compressive stress liners are employed for p-type FETs device performance improvement, yet the same degrades the device performance of n-type FETs.

Dual stress liner technology in which both compressive and tensile stress liners are present or a relaxation implantation (usually compressive for pFET and relaxation for nFET) have been used in the prior art to avoid the degradation.

Despite the above schemes, the SRAM device stability is degraded because of the following: (i) stress liner uniformity in the SRAM region, and (ii) other process variations such as, for example, contact area size and relaxation boundary variation (or tensile and compressive nitride boundary) which can cause the stain variation in the device and therefore the Ion variation for the devices.

As the SRAM dimensions scale down, enhanced SRAM device performance is required in order to obtain good SRAM stability and writability.

In view of the above, there is a need for obtaining SRAM cells wherein the overall device performance is enhanced such that the SRAM has improved stability and writability.

SUMMARY OF THE INVENTION

The present invention provides an IC including at least one SRAM cell in which the performance of the SRAM cell is enhanced, yet maintaining good stability and writability. In particular, the present invention provides an IC including at least one SRAM cell wherein the gamma ratio is about 1.0 or greater. In the present invention, the gamma ratio is increased with degraded pFET device performance. Moreover in the inventive IC there is no stress liner boundary present in the SRAM region and ion variation for all devices is reduced as compared to that of a conventional SRAM structure.

It is noted that for a conventional SRAM cell, the pass-gate transistors and the pull-down transistors typically include a compressive and relaxed nitride stress liner, while the pull-up transistors typically include a non-relaxed compressive stressed liner. Alternatively, the pass-gate transistors and the pull-down transistors may include a tensile stress liner. Such a SRAM cell suffers from stability issues, as discussed above.

The present invention solves the above by providing an integrated circuit (IC) that comprises:

at least one static random access memory cell including at least one nFET and at least one pFET; and a continuous relaxed stressed liner located above and adjoining the at least one nFET and the at least one pFET.

It is noted that in the inventive IC, all transistors, including pass-gate, pull-up and pull-down, within the SRAM cell include a continuous relaxed stressed liner that is located above and adjoining each type of transistor.

Typically, the relaxed stressed liner is a compressive stressed material. More typically, the stressed material is a compressive silicon nitride. The relaxed stressed liner of the present invention includes one of Xe ions and Ge atoms.

The integrated circuit also includes a logic device area (or region) adjacent to an area (or region) including the at least one static random access memory cell wherein the logic device area includes at least one nFET, and at least one pFET. In this embodiment, the relaxed stressed liner is located above and adjoining the at least one nFET of said logic device area and a non-relaxed stressed portion of the liner is located above and adjoining the at least one pFET of the logic device area.

It is emphasized that the stressed liner is a continuous stress liner that has portions that are relaxed and portions that are non-relaxed.

In another embodiment, an integrated circuit (IC) is also provided that includes:

a first area containing at least one SRAM cell, wherein said at least one SRAM cell includes at least one nFET and at least one pFET;

a second area containing at least one logic nFET and at least one logic pFET; and a continuous stressed liner located above and adjoining each FET, wherein a first portion of said continuous stressed liner located in said second area above and adjoining said at least one logic nFET is relaxed, a second portion of said continuous stressed liner located in said second area above and adjoining said at least one logic pFET is non-relaxed, and a third portion of said continuous stressed liner located in said second area above and adjoining said at least one nFET and said at least one pFET is relaxed.

It is again noted that in the inventive IC, all transistors, including pass-gate, pull-up and pull-down, within the SRAM cell include a continuous relaxed stressed liner that is located above and adjoining each type of transistor.

DETAILED DESCRIPTION OF THE INVENTION

The present invention, which provides a technique to increase the performance of a SRAM cell while also improving the stability and writability of the SRAM cell as well as the resultant IC that is fabricated utilizing the same, will now be described in greater detail by referring to the following discussion and drawings that accompany the present application. The drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides an IC including at least one SRAM cell in which the performance of the SRAM cell is enhanced, yet maintaining good stability and writability. In particular, the present invention provides an IC including at least one SRAM cell wherein the gamma ratio is about 1 or greater. In the present invention, the gamma ratio is increased with degraded pFET device performance. Moreover, in the inventive IC there is no stress liner boundary present in the SRAM region and ion variation for all devices is reduced as compared to that of a conventional SRAM structure.

The present invention solves the above by providing an integrated circuit (IC) that comprises at least one static random access memory cell including at least one nFET and at least one pFET; and a continuous relaxed stressed liner located above and adjoining the at least one nFET, and the at least one pFET.

It is noted that in the inventive IC, all transistors, including pass-gate, pull-up and pull-down, within the SRAM cell include a continuous relaxed stressed liner that is located above and adjoining each type of transistor.

Figure 1A:
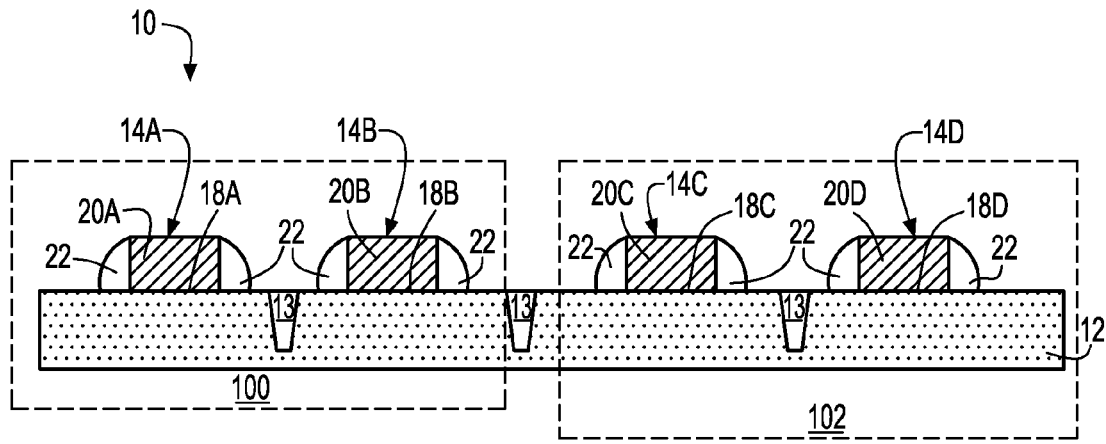
FIGS. 1A-1C are pictorial representations (through cross sectional views) depicting the basic process steps employed in the present invention in fabricating an IC including a high performance SRAM that has improved stability and writability.

The technique employed in the present invention for providing an IC including a high performance SRAM that has improved stability and writability will now be described in greater detail by referring to FIGS. 1A-1C. Specifically, FIG. 1A illustrates an initial IC 10 that can be employed in the present invention. As shown, the IC 10 includes a semiconductor substrate 12 having trench isolation regions 13 therein. The semiconductor substrate 12 includes at least one logic device region 100 and at least one SRAM device region 102. Although such regions are shown, the present invention works equally well with other types of device regions.

Each of the various device regions (i.e., regions or areas 100 and 102) includes transistors 14A, 143, 14C and 14D. In the embodiment illustrated, the transistor 14A represents an nFET, the transistor 14B represents a pFET, the transition 14C represents an nFET of the SRAM cell and transistor 14D represents a pFET of the SRAM cell. Transistors 14C and 14D may comprise a pass-gate transistor, a pull-up transistor or a pull-down transistor of a typical SRAM. Although the drawings depict the presence of one of each of the aforementioned types of transistors, a plurality of such transistors can be located on the surface of the semiconductor substrate 12.

It is noted that in the SRAM device region 102, at least one SRAM cell is present that typically includes six transistors, two pass-gate, two pull-down and two pull-up. The SRAM cell layout that is employed in the present invention includes any conventional layout, including for example, the SRAM layout shown in FIG. 4 of U.S. Pat. No. 6,984,564.

Each transistor shown includes a gate stack that comprises at least a gate dielectric 18A, 18B, 18C, and 18D, and a gate conductor 20A, 20B, 20C and 20D. Also present on the sidewalls of each of the gate stacks is a dielectric spacer 22.

The various elements/components shown in FIG. 1A are comprised of materials that are well known to those skilled in the art. For example, the semiconductor substrate 12 includes any semiconductor material including, for example, Si, SiGe, SiGeC, SiC, Ge alloys, GaAs, InAs, InP and other II/V or II/VI compound semiconductors. The semiconductor substrate 12 may be a bulk substrate, a layered substrate (such as Si/SiGe or a semiconductor-on-insulator (SOI)) or a hybrid substrate that has surface regions of different crystallographic orientation. A preferred semiconductor material for substrate 12 is a Si-containing semiconductor.

The substrate 12 maybe strained, unstrained or contain regions of strain and unstrain therein. The substrate 12 may also be undoped, doped or contain doped regions and undoped regions.

The trench isolation regions 13 are typically comprised of a trench dielectric material such as a trench oxide and are formed utilizing a conventional trench isolation process. The trench isolation region 13 can be replace with field oxide isolation regions or any other type of isolation region used in the art for separating devices from each other.

The transistors can be formed by deposition, lithography, etching or a replacement gate process can be used. The gate dielectric of each transistor may be the same or different insulating material including, for example, oxides, nitrides, oxynitrides and multilayer stacks of any of these insulators. Preferably, an oxide such as, but not limited to, silicon dioxide, is used as the gate dielectric. The gate conductor of each transistor comprises any conductive material including doped polySi, doped SiGe, an elemental metal, an alloy of an elemental metal, a metal silicide or any multilayered stack thereof (e.g., a stack of a metal silicide located atop a polySi base). Preferably, polySi gate conductors are employed. The dielectric spacer of each transistor includes an oxide, nitride, oxynitride and multilayers stacks thereof Preferably, the spacer is an oxide or nitride of silicon.

It will be appreciated by one skilled in the art that during the manufacturing of each transistor dopants can be introduced into the substrate to form source/drain extension regions, halo implant regions, and source/drain diffusion regions within the substrate at the footprint of each of the transistors. Conventional ion implantations processes can be used in forming any of the above-mentioned regions.

As one skilled in the art is also aware the region of the substrate 12 beneath the gate stack of each transistor is the channel of each device. The channel region is typically laterally confined by the implant regions formed above.

Figure 1B:
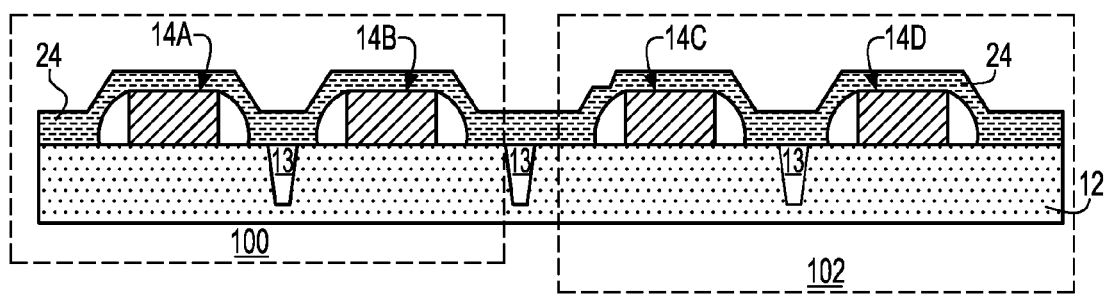

FIG. 1B illustrates the IC structure that is formed after forming a liner 24 on all the exposed surfaces of the structure shown in FIG. 1A. The liner 24 employed in the present invention is a compressive stressed material. The liner 24 may comprise an insulating material such as silicon nitride, a conductive material and/or a semiconductive material. Preferably, silicon nitride is used as the liner 24.

The liner 24 is formed utilizing any conventional deposition process including, for example, a plasma enhanced chemical vapor deposition (PECVD) process as is disclosed in U.S. patent application Publication Ser. No. 2003/0040158 or a high-density plasma (HPD) deposition. The thickness of the liner 24 may vary and it is not critical to the practice of the present invention.

Figure 1C:
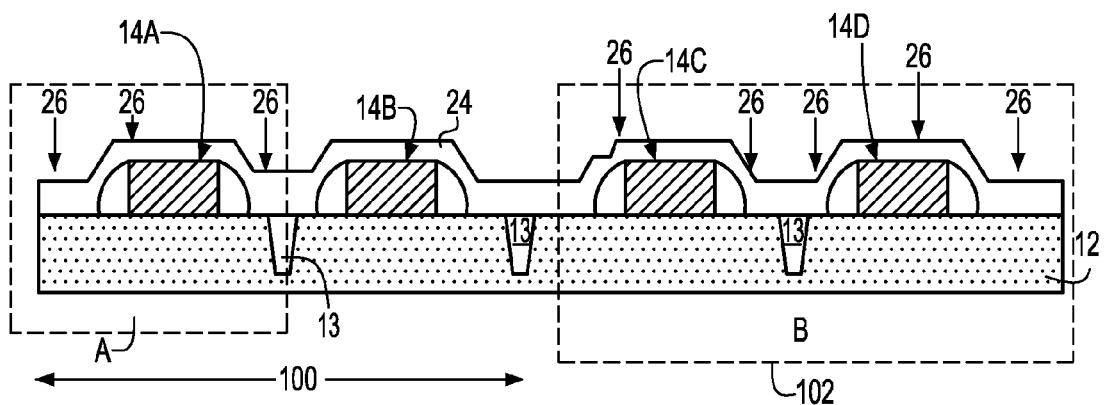

FIG. 1C illustrates the structure during a relaxation step in which ions 26 that are capable of relaxing the liner 24 are selectively implanted into the liner 24 at regions A and B. Region A denotes a region including only the nFET 14A in logic device region 100, while Region B denotes a region including both the nFETs 14C and the pFETs 14D in the SRAM device region 102. The implanted ions 26 comprise at least one of Xe and Ge. The implantation conditions are selected such that the ions 26 are introduced only to the liner 26. Typical ion implantation conditions include: an ion dosage from about 5E14 to about 2E15 atoms/cm$^2$ and an implant energy from about 30 to about 70 keV. The implantation temperature may be nominal room temperature (about 20° C. to about 40° C.).

In FIG. 1C, reference numeral 26' the relaxed stress liner, while reference numeral 26 denotes a non-relaxed stress liner.

Following the above processing conventional steps can be performed on the structure shown in FIG. 1C.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. An integrated circuit (IC) comprising:
   a first area containing at least one SRAM cell, wherein said at least one SRAM cell includes at least one nFET and at least one pFET;
   a second area containing at least one logic nFET and at least one logic pFET; and
   a continuous stressed liner comprising a compressively stressed silicon nitride located above and adjoining each FET, wherein a first portion of said continuous stressed liner located in said second area above and adjoining said at least one logic nFET is relaxed and includes at least one of Xe ions and Ge ions, a second portion of said continuous stressed liner located in said second area above and adjoining said at least one logic pFET is non-relaxed, and a third portion of said continuous stressed liner located in said first area above and adjoining said at least one nFET and said at least one pFET is relaxed and includes at least one of Xe ions and Ge ions.

* * * * *